(12) United States Patent
Jeon et al.

(10) Patent No.: US 9,147,738 B2
(45) Date of Patent: *Sep. 29, 2015

(54) HIGH ELECTRON MOBILITY TRANSISTOR INCLUDING PLURALITY OF GATE ELECTRODES

(71) Applicant: Samsung Electronics Co., Ltd., Suwon-Si, Gyeonggi-Do (KR)

(72) Inventors: Woo-chul Jeon, Daegu (KR); Young-hwan Park, Seoul (KR); Ki-yeol Park, Suwon-si (KR); Jai-kwang Shin, Anyang-si (KR); Jae-joon Oh, Seongnam-si (KR); Jong-bong Ha, Yongin-si (KR); Sun-kyu Hwang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/018,833

(22) Filed: Sep. 5, 2013

(65) Prior Publication Data
US 2014/0151747 A1 Jun. 5, 2014

(30) Foreign Application Priority Data
Nov. 30, 2012 (KR) .................. 10-2012-0138511
Mar. 28, 2013 (KR) .................. 10-2013-0033668

(51) Int. Cl.
*H01L 29/66* (2006.01)
*H01L 29/423* (2006.01)
(Continued)

(52) U.S. Cl.
CPC ...... *H01L 29/42316* (2013.01); *H01L 29/7787* (2013.01); *H01L 29/2003* (2013.01)

(58) Field of Classification Search
CPC ............. H01L 29/778; H01L 29/7787; H01L 29/66431; H01L 29/42316; H01L 29/42324
USPC ........................................................ 257/194
See application file for complete search history.

(56) References Cited

U.S. PATENT DOCUMENTS

| 7,038,253 B2 | 5/2006 | Yoshida et al. |
| 7,342,272 B2 | 3/2008 | Abbott |
| 8,772,834 B2 * | 7/2014 | Jeon et al. .................. 257/194 |

(Continued)

FOREIGN PATENT DOCUMENTS

| KR | 2001-0041025 A | 5/2001 |
| KR | 2003-0014761 A | 2/2003 |

(Continued)

*Primary Examiner* — Tu-Tu Ho
(74) *Attorney, Agent, or Firm* — Harness, Dickey & Pierce, P.L.C.

(57) ABSTRACT

According to example embodiments, a high electron mobility transistor includes: a channel layer including a first semiconductor material; a channel supply layer on the channel layer and configured to generate a 2-dimensional electron gas (2DEG) in the channel layer, the channel supply layer including a second semiconductor material; source and drain electrodes spaced apart from each other on the channel layer, and an upper surface of the channel supply layer defining a gate electrode receiving part; a first gate electrode; and at least one second gate electrode spaced apart from the first gate electrode and in the gate electrode receiving part. The first gate electrode may be in the gate electrode receiving part and between the source electrode and the drain electrode. The at least one second gate electrode may be between the source electrode and the first gate electrode.

27 Claims, 7 Drawing Sheets

(51) Int. Cl.
*H01L 29/778* (2006.01)
*H01L 29/20* (2006.01)

(56) References Cited

U.S. PATENT DOCUMENTS

2010/0097105 A1* 4/2010 Morita et al. .................. 327/109
2013/0105812 A1* 5/2013 Ishigaki et al. ................. 257/76

FOREIGN PATENT DOCUMENTS

KR 2008-0050459 A 6/2008
KR 2011-0079043 A 7/2011

* cited by examiner

HIGH ELECTRON MOBILITY TRANSISTOR INCLUDING PLURALITY OF GATE ELECTRODES

CROSS-REFERENCE TO RELATED APPLICATIONS

This application claims priority under 35 U.S.C. §119 to Korean Patent Application No. 10-2012-0138511, filed on Nov. 30, 2012, and Korean Patent Application No. 10-2013-0033668, filed on Mar. 28, 2013, in the Korean Intellectual Property Office. The disclosures of both of the above-referenced applications are incorporated herein in their entirety by reference.

BACKGROUND

1. Field

The present disclosure relates to a semiconductor device, and more particularly, to a high electron mobility transistor.

A. 2. Description of the Related Art

Devices for controlling a current flow through ON/OFF switching, e.g., power devices, may be used for various power conversion systems. In such a power conversion system, the efficiency of a power device affects that of the whole system.

Power devices being commercialized currently are mostly classified into silicon-based power metal-oxide-semiconductor field-effect transistors (MOSFETs) or insulated gate bipolar transistors (IGBTs). However, due to the limits of silicon's physical properties and manufacturing processes, it is difficult to increase the efficiency of the silicon-base power devices. To overcome these limits, research and development for increasing conversion efficiency by applying the group III-V-based compound semiconductors into power devices are in progress. In a related development, high electron mobility transistors (HEMTs) using a heterojunction structure of compound semiconductors are in the spotlight.

Such a HEMT may include semiconductor layers having electrical polarization characteristics different from each other. In the HEMT, a semiconductor layer having relatively large polarizability may induce a 2-dimensional electron gas (2DEG) in the other semiconductor layer bonded to the semiconductor layer. Here, the 2DEG may have very high electron mobility.

If a gate voltage is 0 V in the HEMT, when the HEMT is in a normally-on state in which current flows due to low resistance between a drain electrode and a source electrode, current and power loss may occur. Thus, to turn the current between the drain electrode and the source electrode off, a negative voltage should be applied into the gate electrode. Recently, to solve the above-described limitation, a HEMT which includes a depletion formation layer or a recess structure under the gate electrode to realize a normally-off characteristic in which the current between the drain electrode and the source electrode is turned off when the gate voltage is 0 V is being studied.

SUMMARY

Example embodiments relate to a high electron mobility transistor having a normally-off characteristic and an increased threshold voltage.

Additional aspects will be set forth in part in the description which follows and, in part, will be apparent from the description, or may be learned by practice of example embodiments.

According to example embodiments, a high electron mobility transistor includes: a channel layer including a first semiconductor material; a channel supply layer on the channel layer, the channel supply layer including a second semiconductor material, the channel supply layer configured to generate a 2-dimensional electron gas (2DEG) in the channel layer, and an upper surface of the channel supply layer defining a gate electrode receiving part; source and drain electrodes spaced apart from each other on the channel layer; a first gate electrode in the gate electrode receiving part and between the source electrode and the drain electrode; at least one second gate electrode spaced apart from the first gate electrode and in the gate receiving part, the at least one second gate electrode between the source electrode and the first gate electrode.

In example embodiments, the at least one second gate electrode may include a floating electrode, and the first gate electrode may be configured to induce a second gate voltage into the floating electrode if a first gate voltage is applied to the first gate electrode.

In example embodiments, the gate electrode receiving part may include a first gate electrode receiving part and a second gate electrode receiving part. The first gate electrode may be in the first gate electrode receiving part. The second gate electrode may be in the second gate electrode receiving part. The gate electrode receiving part may have a recess shape, and the gate electrode receiving part may be recessed toward the channel layer.

In example embodiments, a depth of the gate electrode receiving part may extend to one of: an interface between the channel layer and the channel supply layer, and a depth less than the interface between the channel layer and the channel supply layer. A depth of the first gate electrode receiving part may be less than a depth of the second gate electrode receiving part.

In example embodiments, the high electron mobility transistor may further include an insulation layer between the gate electrode receiving part and the first and second gate electrodes.

In example embodiments, the first gate electrode may be configured to induce the second gate voltage into the floating electrode through a top surface of the channel supply layer if the first gate voltage is applied to the first gate electrode. The second gate voltage induced into the second gate electrode may be determined by the first gate voltage applied to the first gate electrode, a distance between the first gate electrode and the floating electrode, and a distance between the floating electrode and the source electrode.

In example embodiments, a threshold voltage of the high electron mobility transistor may be affected by the second gate voltage induced into the floating electrode.

In example embodiments, the first semiconductor material may be a GaN-based material. The second semiconductor material may be at least one nitride that includes at least one of Al, Ga, In, and B.

According to example embodiments, a high electron mobility transistor includes: a channel layer including a first semiconductor material; a channel supply layer on the channel layer, the channel supply layer including a second semiconductor material, the channel supply layer configured to generate a 2-dimensional electron gas (2DEG) in the channel layer, and an upper surface of the channel supply layer defining a gate electrode receiving part; source and drain electrodes spaced apart from each other on the channel layer; a first gate electrode on the channel supply layer between the source electrode and the drain electrode; at least one second gate electrode in the gate receiving part, the at least one second gate electrode spaced apart from the first gate electrode and between the source electrode and the first gate electrode.

In example embodiments, the high electron mobility transistor may further include: a first resistive layer connecting the first gate electrode to one of the at least one second gate electrode; and a second resistive layer connecting one of the at least one second gate electrode to the source electrode.

In example embodiments, at least one of the first and second resistive layers may have a stripe shape.

In example embodiments, at least one of the first and second resistive layers may have a film shape.

In example embodiments, a resistance value of each of the first and second resistive layers may exceed about 100 kΩ.

In example embodiments, the second gate voltage induced into the second gate electrode may be determined by a first gate voltage applied to the first gate electrode, a resistance value of the first resistive layer, and a resistance value of the second resistive layer.

In example embodiments, at least one of the first and second resistive layers may be on the channel supply layer.

In example embodiments, the high electron mobility transistor may further include an insulation layer between the channel supply layer and at least one of the first and second resistive layers.

BRIEF DESCRIPTION OF THE DRAWINGS

These and/or other aspects will become apparent and more readily appreciated from the following description of non-limiting embodiments, as illustrated in the accompanying drawings. In the drawings.

DETAILED DESCRIPTION

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
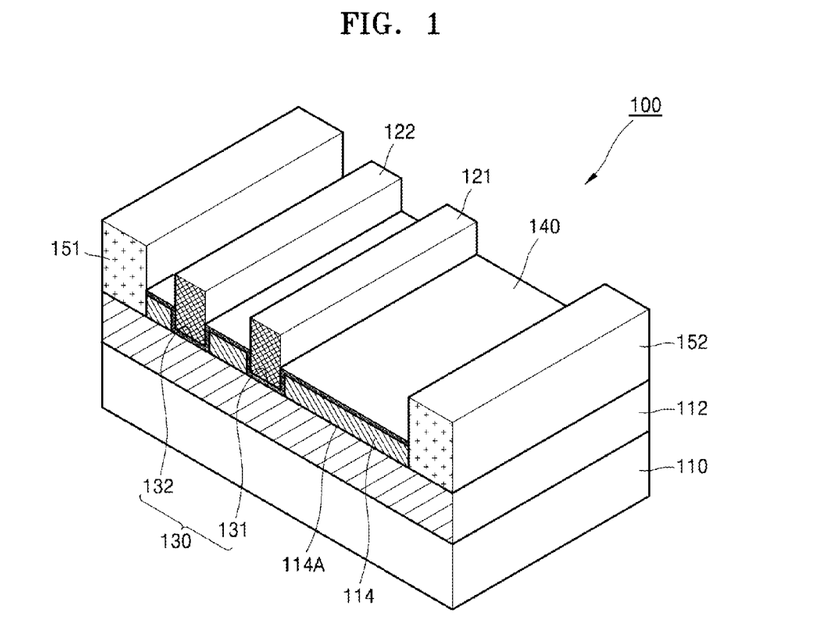
FIG. 1 is a perspective view of a high electron mobility transistor according to example embodiments.
Figure 2:
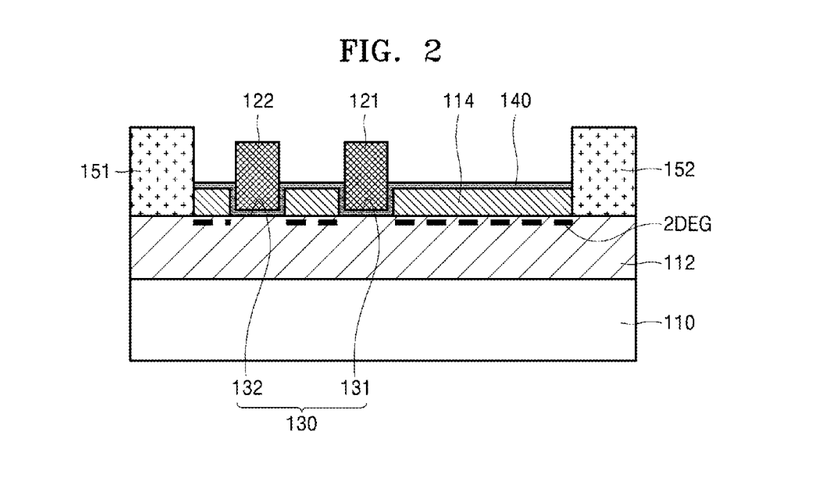
FIG. 2 is a cross-sectional view of the high electron mobility transistor of FIG. 1.

FIG. 1 is a perspective view of a high electron mobility transistor (HEMT) 100 according to example embodiments, and FIG. 2 is a cross-sectional view of the HEMT 100 of FIG. 1.

Referring to FIGS. 1 and 3, a channel layer 112 is disposed on a substrate 110. The substrate 110 may include, for example, sapphire, Si, SiC, or GaN. However, this is merely an example, and thus the substrate 110 may include various different materials. The channel layer 112 may include a first semiconductor material. Here, the first semiconductor material may be group III-V based compound semiconductor materials, but example embodiments are not limited thereto. For example, the channel layer 110 may include a GaN-based material layer, particularly, a GaN layer. In this case, the channel layer 110 may include an undoped GaN layer. In some cases, the channel layer 110 may include a GaN layer doped with desired (or alternatively predetermined) impurities.

Although not shown, a desired (or alternatively predetermined) buffer layer may be further disposed between the substrate 110 and the channel layer 112. The buffer layer may reduce a lattice constant and thermal expansion coefficient difference between the substrate 110 and the channel layer 112 to limit (and/or prevent) crystallinity of the channel layer 112 from being deteriorated. The buffer layer may include at least one material selected from nitrides including at least one of Al, Ga, In, and B. The buffer layer may have a single layer or multilayer structure. The buffer layer may include, for example, at least one of AlN, GaN, AlGaN, InGaN, AlInN, and AlGaInN. A seed layer (not shown) for growing the buffer layer may be further disposed between the substrate 110 and the buffer layer.

A channel supply layer 114 may be disposed on the channel layer 112. The channel supply layer 114 may generate a 2-dimensional electron gas (2DEG) in the channel layer 112. Here, the 2DEG may be generated within the channel layer 112 under an interface between the channel layer 112 and the channel supply layer 114. The channel supply layer 114 may include a second semiconductor material different from a first semiconductor material constituting the channel layer 112. The second semiconductor material may be different from the first semiconductor material in at least one of a polarization characteristic, an energy band gap, and a lattice constant. Particularly, at least one of the polarizability and energy band gap of the second semiconductor material may be greater than those of the first semiconductor material.

The channel supply layer 114 may include, for example, at least one selected from nitrides including at least one of Al, Ga, In, and B. The channel supply layer 114 may have a single layer or multilayer structure. In detail, the channel supply layer 114 may include at least one of AlGaN, AlInN, InGaN, AlN, and AlInGaN. However, example embodiments are not limited to. The channel supply layer 114 may be an undoped layer or a layer doped with desired (or alternatively predetermined) impurities. The channel supply layer 114 may have, for example, a thickness of about several ten nm or less. For example, the channel may have a thickness of about 50 nm or less, but is not limited thereto.

A source electrode 151 and a drain electrode 152 may be disposed on the channel layer 112 on both sides of the channel supply layer 114. Here, the source electrode 151 and the drain electrode 152 may be electrically connected to the 2DEG. The source electrode 151 and the drain electrode 152 may be disposed on the channel supply layer 114. Alternatively, the source electrode 151 and the drain electrode 152 may be inserted into the channel supply layer 114 or the channel layer 112. In addition, the source electrode 151 and the drain electrode 152 may vary in shape.

First and second gate electrodes 121 and 122 may be disposed between the source electrode 151 and the drain electrode 152 to control current flowing between the source electrode 151 and the drain electrode 152. The first gate electrode 121 may be disposed between the source electrode 151 and the drain electrode 152, and the second gate electrode 122 may be disposed between the source electrode 151 and the first gate electrode 121. The first and second gate electrodes 121 and 122 may form a Schottky contact with the channel supply layer 114. In this case, the first and second gate electrodes 121 and 122 may include materials (e.g., a metal, a metal compound, etc.) which form the Schottky contact with the channel supply layer 114. However, in some cases, the first and second gate electrodes 121 and 122 may not form the Schottky contact with the channel supply layer 114.

The HEMT 100 may have a normally-off structure. The normally-off structure represents a structure in which current between the drain electrode 152 and the source electrode 151 is turned off when a voltage is not applied into the first and second gate electrodes 121 and 122, e.g., in a normal state, and the current between the drain electrode 152 and the source electrode 151 is turned on when a voltage is applied between the first and second gate electrodes 121 and 122.

As an example of the normally-off structure, the first and second gate electrodes 121 and 122 may be received into a gate electrode receiving part 130 disposed between the source electrode 151 and the drain electrode 152. The gate electrode receiving part 130 may be disposed in the channel supply layer 114. The gate electrode receiving part 130 may include first and second gate electrode receiving parts 131 and 132. Here, each of the first and second gate electrode receiving parts 131 and 132 may have a recess shape which is recessed from the channel supply layer 114 toward the channel layer 112. The gate electrode receiving part 130 may be formed by etching the channel supply layer 114. The gate electrode receiving part 130 may have a depth up to an interface 114A between the channel layer 112 and the channel supply layer 114 or a depth less than that up to the interface 114A, e.g., a depth at which the gate electrode receiving part 130 is spaced apart from the interface 114A. The first and second gate electrodes 121 and 122 may be disposed in the first and second gate electrode receiving parts 131 and 132, respectively. The 2DEG may not be generated in lower regions of the first and second gate electrodes 121 and 122 or have characteristics (e.g., an electron concentration, etc.) different from those of the rest of the regions. Thus, when a voltage is not applied into the first and second gate electrodes 121 and 122, as shown in FIG. 2, the 2DEG may not be generated under the first and second gate electrodes 121 and 122, and thus the first and second electrodes 121 and 122 may become in OFF states.

An insulation layer 140 for limiting (and/or preventing) leakage current from occurring may be disposed between the first gate electrode receiving part 130 and the first and second gate electrodes 121 and 122. The insulation layer 140 may be disposed along the first and second gate electrodes 121 and 122 on the gate electrode receiving part 130 of the channel supply layer 114. The insulation layer 140 may include, for example, one of $Al_2O_3$, $SiO_x$, $Si_xN_y$, $Sc_2O_3$, AlN, $Ga_2O_3$, Gd$_2$O$_3$, Al$_x$Ga$_{2(1-x)}$O$_3$, MgO, and combinations thereof. In addition, any insulation materials used for general transistors may be applied as materials for the insulation layer 140. In the case where the insulation layer 140 is used, the first and second gate electrodes 121 and 122 need not to form the Schottky contact with the channel supply layer 114. Thus, a kind of material usable as the first and second gate electrodes 121 and 122 may be expanded when compared to a case that uses the Schottky contact. Also, the first and second gate electrodes 121 and 122 may be formed of the same material as those of the source electrode 151 and the drain electrode 152.

The first gate electrode 121 may include various metal materials or metal compounds. The first gate electrode 121 may have a desired (or alternatively predetermined) width. Also, the first gate electrode 121 may be disposed closer to the source electrode 151 than the drain electrode 152. However, this is merely an example, and the first gate electrode 121 may be variously changed in position. The second gate electrode 122 may be disposed between the source electrode 151 and the first gate electrode 121. The second gate electrode 122 may be spaced a desired (or alternatively predetermined) distance from the first gate electrode 121. The second gate electrode 121 may include the same material as that of the first gate electrode 121. However, example embodiments are not limited thereto.

The second gate electrode 122 may be a floating electrode in which a second gate voltage is induced as a first gate voltage is applied into the first gate electrode 121. When the first gate voltage is applied into the first gate electrode 121, the second gate voltage may be induced into the second gate electrode 122 through a top surface of the channel supply layer 114 between the first gate electrode 121 and the second gate electrode 122. Here, a voltage less than that applied into the first gate electrode 121 may be induced into the second gate electrode 122. The second gate voltage induced into the second gate electrode 122 may be determined by the first gate voltage applied into the first gate electrode 121, a distance between the first gate electrode 121 and the second gate electrode 122, and a distance between the source electrode 151 and the second gate electrode 122. Particularly, when the first gate voltage is $V_{g1}$, the distance between the first gate electrode 121 and the second gate electrode 122 is $L_{fg}$, and the distance between the source electrode 151 and the second gate electrode 122 is $L_{sf}$, the second gate voltage $V_{g2}$ induced into the second gate electrode 122 may be calculated by the following formula: $V_{g1} \times L_{sf}/(L_{fg}+L_{sf})$ Here, the second gate voltage $V_{g2}$ may be adjusted by changing a position(s) of the first gate electrode 121 and/or the second gate electrode 122.

As described below, the second gate electrode 122 that is the floating electrode may increase a threshold voltage of the HEMT 100. Thus, the threshold voltage of the HEMT 100 may be determined (and/or affected) by the second gate voltage induced into the second gate electrode 122.

Figure 3A:
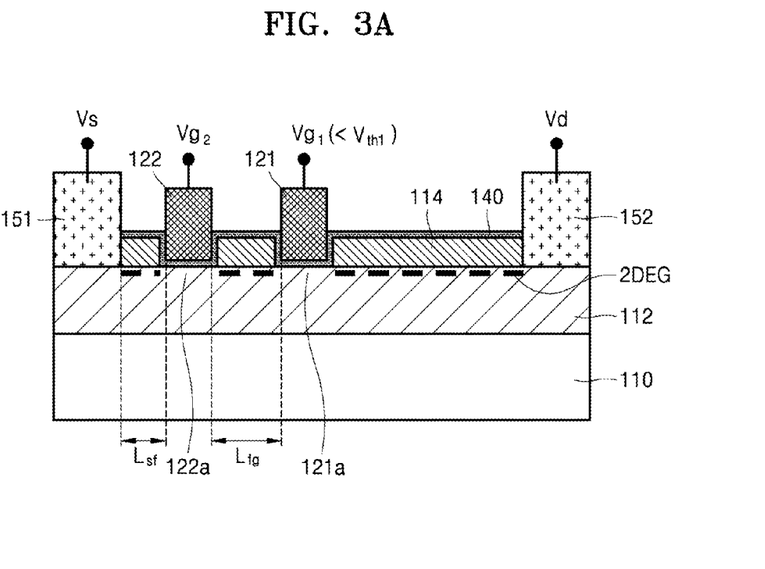
FIGS. 3A to 3C are views illustrating a process of forming a channel according to a first gate voltage in the high electron mobility transistor of FIG. 1.
Figure 3B:
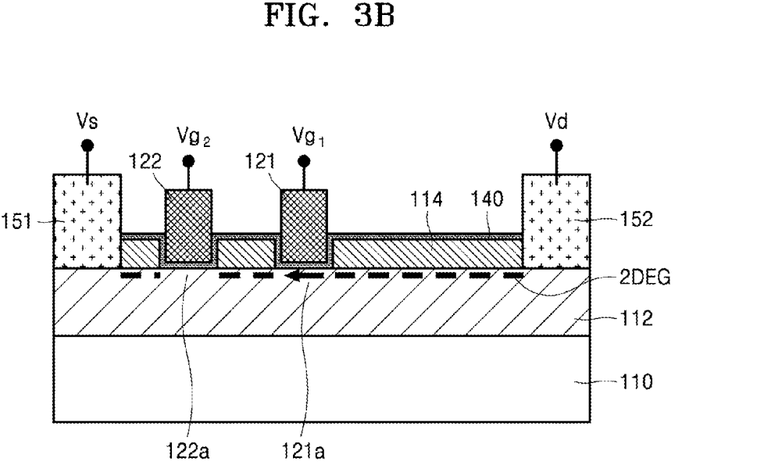
Figure 3C:
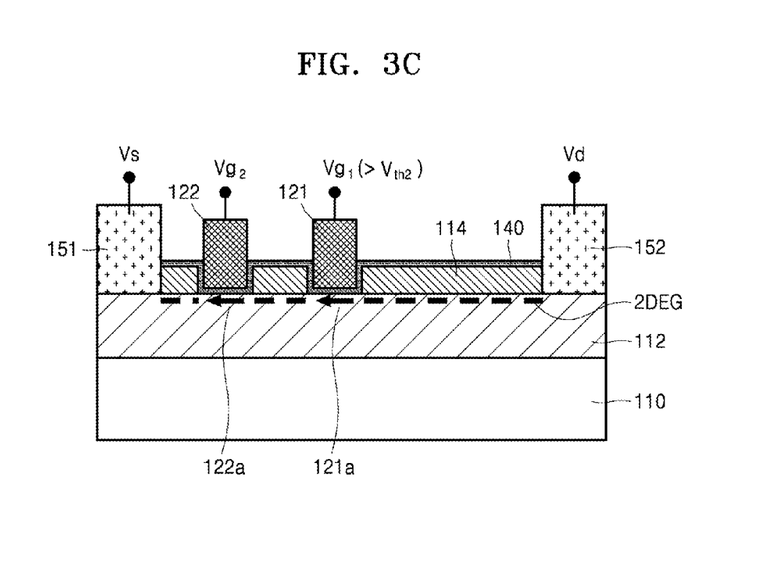

FIGS. 3A to 3C are views illustrating a process of forming a channel according to a voltage applied into the first gate electrode 121 in the HEMT 100. Here, a desired (or alternatively predetermined) source voltage Vs and drain voltage $V_d$ may be applied into the source electrode 151 and the drain electrode 152, respectively. In the HEMT 100 of FIGS. 3A to 3C, when the first gate voltage applied into the first gate electrode 121 is $V_{g1}$, the distance between the first gate electrode 121 and the second gate electrode 122 is $L_{fg}$, and the distance between the source electrode 151 and the second gate electrode 122 is $L_{sf}$, the second gate voltage $V_{g2}$ induced in the second gate electrode 122 that is the floating electrode may be calculated by the following formula: $V_{g1} \times L_{sf}/(L_{fg}+L_{sf})$.

FIG. 3A illustrates a case in which the first gate voltage $V_{g1}$ applied into the first gate electrode 121 is less than a first threshold voltage $V_{th1}$. Here, the first threshold voltage $V_{th1}$ represents a minimum voltage at which channels formed under the first and second gate electrodes are in ON states. Referring to FIG. 3A, when the first gate voltage $V_{g1}$ applied into the first gate electrode 121 is less than the first threshold voltage $V_{th1}$, the second gate voltage $V_{g2}$ induced into the second gate electrode 122 may be less than the first threshold voltage $V_{th1}$. Thus, a first channel 121a formed under the first gate electrode 121 and a second channel 122a formed under the second gate electrode 122 may become in OFF states.

FIG. 3B illustrates a case in which the first gate voltage $V_{g1}$ applied into the first gate electrode 121 is greater than the first threshold voltage $V_{th1}$ and less than a second threshold voltage $V_{th2}$. Here, the second threshold voltage $V_{th2}$ may be calculated by the following formula: $V_{th1} \times (L_{fg}+L_{sf})/L_{sf}$. Referring to FIG. 3B, when the first gate voltage $V_{g1}$ applied into the first gate electrode 121 is greater than the first threshold voltage $V_{th1}$ and less than the second threshold voltage $V_{th2}$, the second gate voltage $V_{g2}$ induced into the second gate electrode 122 may be less than the first threshold voltage $V_{th1}$. Thus, the first channel 121a formed under the first gate electrode 121 is in the ON state, but the second channel 122a formed under the second gate electrode 122 may become in an OFF state.

FIG. 3C illustrates a case in which the first gate voltage $V_{g1}$ applied into the first gate electrode 121 is greater than the second threshold voltage $V_{th2}$. Referring to FIG. 3C, when the first gate voltage $V_{g1}$ applied into the first gate electrode 121 is greater than the second threshold voltage $V_{th2}$, the second gate voltage $V_{g2}$ induced into the second gate electrode 122 may be greater than the first threshold voltage $V_{th1}$. Thus, the first channel 121a formed under the first gate electrode 121 and the second channel 122a formed under the second gate electrode 122 may become in the ON states. Thus, current may flow into the channel layer 112 of the HEMT 100.

As described above, according to example embodiments, the HEMT 100 may have a normally-off characteristic. Also, since the second gate electrode 122 that is the floating electrode is provided between the source electrode 151 and the first gate electrode 121, the threshold voltage $V_{th}$ of the HEMT 100 may increase from the first threshold voltage $V_{th1}$ to the second threshold voltage $V_{th2}$. Also, since the first gate electrode 121 and/or the second gate electrode 122 is(are) changed in position, the threshold voltage $V_{th}$ of the HEMT 100 may be adjusted. Although FIG. 3 illustrates one second gate electrode 122 is provided between the source electrode 151 and the first gate electrode 121, a plurality of second gate electrodes 122 may be provided between the source electrode 151 and the first gate electrodes 121.

Figure 4:
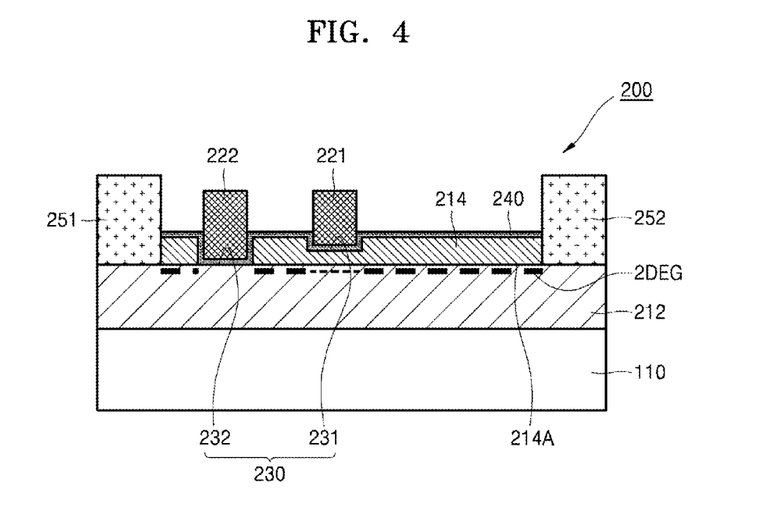
FIG. 4 is a cross-sectional view of a high electron mobility transistor according to example embodiments.

FIG. 4 is a cross-sectional view of a HEMT 200 according to example embodiments. The HEMT 200 is the same as that 100 of FIG. 1 except that a first gate electrode receiving part 231 has a depth less than that of a second gate electrode receiving part 232. Thus, differences between the HEMT 100 and HEMT 200 will be mainly described below.

Referring to FIG. 4, first and second gate electrodes 221 and 222 may be received into a gate electrode receiving part 230 disposed between a source electrode 251 and a drain electrode 252. The gate electrode receiving part 230 may include the first and second gate electrode receiving parts 231 and 232. Here, each of the first and second gate electrode receiving parts 231 and 232 may have a recess shape which is recessed from a channel supply layer 214 toward a channel layer 212. The gate electrode receiving part 230 may be formed by etching the channel supply layer 214. The gate electrode receiving part 230 may have a depth up to an interface 214A between the channel layer 212 and the channel supply layer 214 or a depth less than that up to the interface 214A. The first gate electrode receiving part 231 may have a depth less than that of the second gate electrode receiving part 232. For example, the first gate electrode receiving part 231 may have a depth less than that of the interface 214A, e.g., be spaced a desired (or alternatively predetermined) distance from the interface 214A. Also, the second gate electrode receiving part 232 may have a depth reaching the interface 214A. The first and second gate electrodes 221 and 222 may be disposed in the first and second gate electrode receiving parts 231 and 232, respectively. Thus, although a 2DEG is generated in a lower region of the first gate electrode 221 as shown in FIG. 4, the 2DEG may not be generated in a lower region of the second gate electrode 222. As a result, the second gate electrode 222 may become in an OFF state. The first gate electrode receiving part 231 may be variously adjusted in depth. An insulation layer 240 for limiting (and/or preventing) leakage current from occurring may be disposed between the gate electrode receiving part 230 and the first and second gate electrodes 221 and 222.

The second gate electrode 222 may be a floating electrode in which a second gate voltage is induced as a first gate voltage is applied into the first gate electrode 221. Here, a voltage less than that applied into the first gate electrode 222 may be induced into the second gate electrode 221. The second gate voltage induced in the second gate electrode 222 may be determined by the first gate voltage applied into the first gate electrode 221, a distance between the first gate electrode 221 and the second gate electrode 222, and a distance between the source electrode 251 and the second gate electrode 222. Particularly, when the first gate voltage is $V_{g1}$, the distance between the first gate electrode 221 and the second gate electrode 222 is $L_{fg}$, and the distance between the source electrode 251 and the second gate electrode 222 is $L_{sf}$, the second gate voltage $V_{g2}$ induced in the second gate electrode 222 may be calculated by the following formula: $V_{g1} \times L_{sf}/(L_{fg}+L_{sf})$. Here, the second gate voltage $V_{g2}$ may be adjusted by changing a position(s) of the first gate electrode 221 and/or the second gate electrode 222.

According to example embodiments, the second gate electrode 222 that is the floating electrode may increase a threshold voltage of the HEMT 200. Thus, the threshold voltage of the HEMT 200 may be determined by the second gate voltage induced into the second gate electrode 222. Also, since the lower region of the first gate electrode 221 is adjustable so that the lower region is not disconnected, an increase of ON-resistance may be limited (and/or prevented) on the whole.

Figure 5:
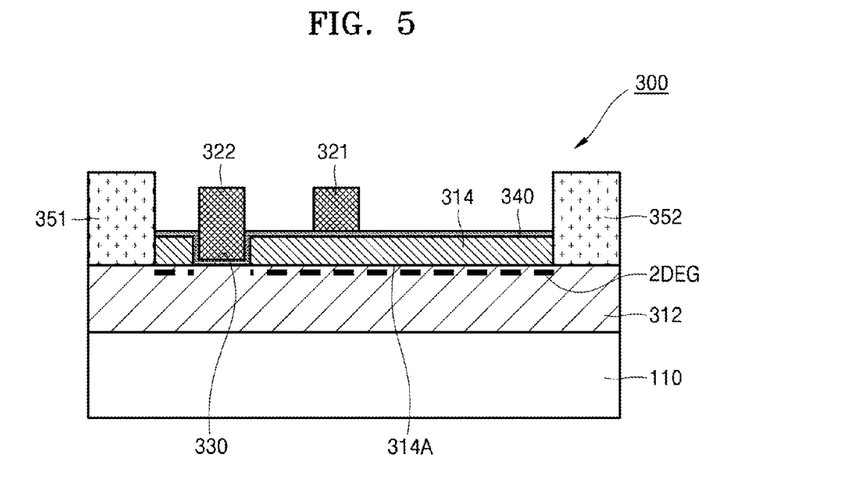
FIG. 5 is a cross-sectional view of a high electron mobility transistor according to example embodiments.

FIG. 5 is a cross-sectional view of a HEMT 300 according to example embodiments. Hereinafter, differences between the HEMT 300 in FIG. 5 and the HEMTS 100 and 200 in FIGS. 1 and 4 will be mainly described.

Referring to FIG. 5, a first gate electrode 321 may be disposed between a source electrode 351 and a drain electrode 352, and a second gate electrode 322 may be disposed between the source electrode 351 and the first gate electrode 321. The first gate electrode 321 may be disposed on a channel supply layer 314. Also, the second gate electrode 322 may be received into a gate electrode receiving part 330 disposed between the source electrode 351 and the drain electrode 352. The gate electrode receiving part 330 may have a recess shape which is recessed from a channel supply layer 314 toward a channel layer 312. The gate electrode receiving part 330 may be formed by etching the channel supply layer 314. The gate electrode receiving part 330 may have a depth up to an interface 314A between the channel layer 312 and the channel supply layer 314 or a depth less than that up to the interface 214A. Although a 2DEG is generated in a lower region of the first gate electrode 321, the 2DEG may not be generated in a lower region of the second gate electrode 322 received into the gate electrode receiving part 330. As a result, the second gate electrode 322 may become in an OFF state.

An insulation layer 340 for limiting (and/or preventing) leakage current from occurring may be disposed between the first and second gate electrodes 321 and 322 and the channel supply layer 314. Particularly, the insulation layer 340 may be disposed between the first gate electrode 321 and the channel supply layer 314. Also, the insulation layer 340 may be disposed between the second gate electrode 322 and the gate electrode receiving part 330. The insulation layer 340 may include, for example, one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof. In addition, any insulation materials used for general transistors may be applied as materials for the insulation layer 340.

Figure 6:
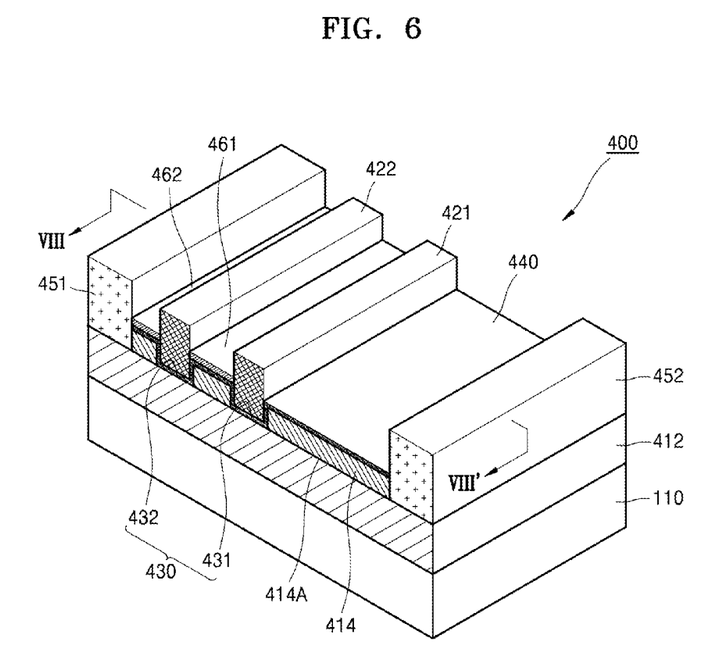
FIGS. 6 and 7 are perspective views of a high electron mobility transistor according to example embodiments.
Figure 7:
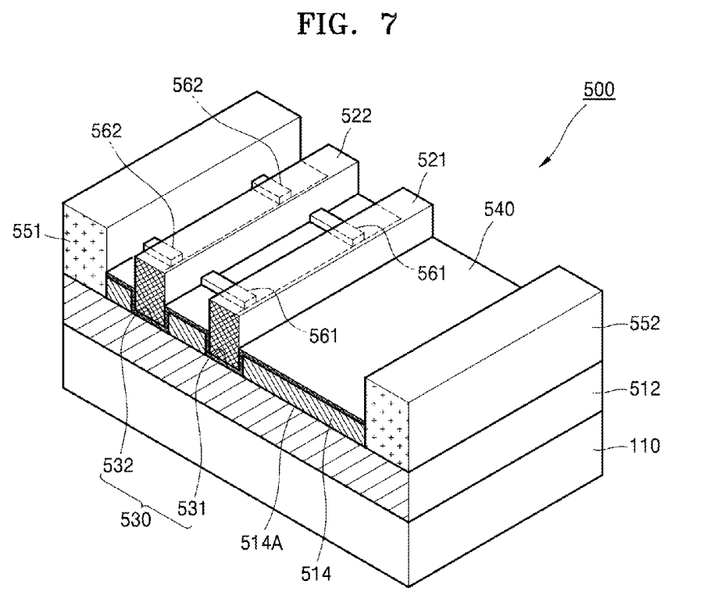
Figure 8:
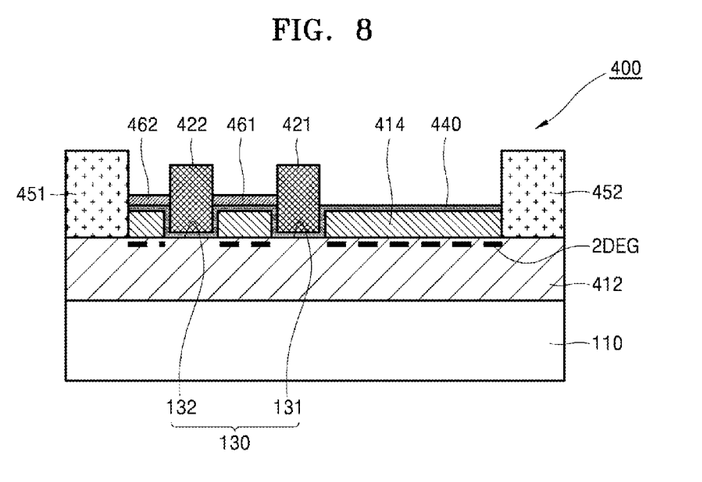
FIG. 8 is a cross-sectional view taken along line VIII-VIII' in the high electron mobility transistor of FIG. 6.

FIGS. 6 and 7 are perspective views of high electron mobility transistors 400 and 500 according to example embodiments, and FIG. 8 is a cross-sectional view taken along line VIII-VIII' in the high electron mobility transistor 400 of FIG. 6. Hereinafter, points different from those of the HEMTs 100, 200 and 300 discussed above will be mainly described.

Referring to FIGS. 6 to 8, the high electron mobility transistor 400 may further include a first resistive layer 461 and a second resistive layer 462. The first resistive layer 461 connects a first gate electrode 421 to a second gate electrode 422, and the second resistive layer 462 connects the second gate electrode 422 to a source electrode 461. The first resistive layer 461 and the second resistive layer 462 may be disposed on a channel supply layer 414 so that the first and second resistive layers 461 and 462 do not have an influence on a 2DEG generated in lower regions thereof. An insulation layer 440 may be disposed between the first and second resistive layers 461 and 462 and the channel supply layer 414. The insulation layer 440 may include, for example, at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and combinations thereof. In addition, any insulation materials used for general transistors may be applied as materials for the insulation layer 440. The channel supply layer 414 may define a gate electrode receiving part 430 that includes a first and second gate electrode receiving parts 431 and 432, respectively. A drain electrode 452 may be spaced apart from the first gate electrode 421 on the channel layer 412. The first gate electrode 421 and second gate electrode 422 may be received in the first and second gate electrode receiving parts 431 and 432.

Each of the first and second resistive layers 461 and 462 may have a film shape as shown in FIG. 6. However, the shapes of the first and second resistive layers 461 and 462 are not limited thereto. For example, each of first and second resistive layers 561 and 562 may have a stripe shape as shown in FIG. 7. Here, the stripe shape may represents a pattern that is locally formed along a direction crossing a channel direction between a source electrode 551 and a drain electrode 552. As shown in FIG. 7, the stripe may be defined by two lines as well as one line or three lines. As shown in FIG. 7, The channel supply layer 514 may define a gate electrode receiving part 530 that includes a first and second gate electrode receiving parts 531 and 532, respectively. The first gate electrode 521 and second gate electrode 522 may be received in the first and second gate electrode receiving parts 531 and 532. An insulation layer 540 may be disposed between the first and second resistive layers 561 and 562 and the channel supply layer 514. The insulation layer 540 may be on a portion of the channel supply layer 514 between the first gate electrode 521 and the drain electrode 552.

As described above, since the first and second resistive layers 461 and 462 connect the source electrode 451, the second gate electrode 422, and the first gate electrode 421 to each other, electric charges that accumulate in the second gate electrode 422 may move to the source electrode 451, and thus a switching speed may be improved.

Also, a second gate voltage induced by the second gate electrode 422 may be determined by a first gate voltage, a resistance value of the first resistive layer 461, and a resistance value of the second resistive layer 462. Particularly, when a first gate voltage applied into the first gate electrode 121 is $V_{g1}$, a resistance value of the first resistive layer 461 is $R_{fg}$, and a resistance value of the second resistive layer 462 is $R_{sf}$, a second gate voltage $V_{g2}$ induced into the second gate electrode 422 may be calculated as the following formula: $V_{g2}=V_{g1} \times R_{sf}/(R_{sf}+R_{fg})$. However, since the calculation formula presupposes a case in which contact resistance $R_{cr}$ between the source electrode 451 and the 2DEG is significantly less than resistance $R_s$ of the 2DEG itself ($R_{cr} \ll R_s$), if the contact resistance $R_{cr}$ is similar to the resistance $R_s$, or the contact resistance $R_{cr}$ is significantly greater than the resistance $R_s$, the second gate voltage $V_{g2}$ may be calculated as following.

For example, if the contact resistance $R_{cr}$ is similar to the resistance $R_s$, the second gate voltage $V_{g2}$ may be calculated as the following formula: $V_{g2}=V_{g1} \times (R_{cr}+R_{sf})/(R_{cr}+R_{sf}+R_{fg})$. Also, if the contact resistance $R_{cr}$ is significantly greater than the resistance $R_s$, the second gate voltage $V_{g2}$ may be calculated as the following formula: $V_{g2}=V_{g1}$. Here, the meaning of the term "significant great or less" may represent a case in which the contact resistance is greater or less by about 10 times than the resistance $R_s$.

Each of the first and second resistive layers 461 and 462 may have high resistance to limit (and/or prevent) leakage current form occurring. For example, each of the first and second resistive layers 461 and 462 may have a resistance value that exceeds about 100 kΩ. Alternatively, each of the first and second resistive layers 461 and 462 may have a resistance value less than about 10,000 ka within a range that is not contrary to the installation purposes of the first and second resistive layers 461 and 462. The resistance value of each of the first and second resistive layers 461 and 462 may be determined by a characteristic, length, width, and temperature of a material thereof.

Each of the first and second resistive layers 461 and 462 may be formed of a metal that is usable in a complementary metal-oxide semiconductor (CMOS) process. However, the materials of the first and second resistive layers 461 and 462 are not limited thereto. For example, each of the first and second resistive layers 461 and 462 may be formed of a conductive material, e.g., TiN, TiW, or poly silicon.

Figure 9:
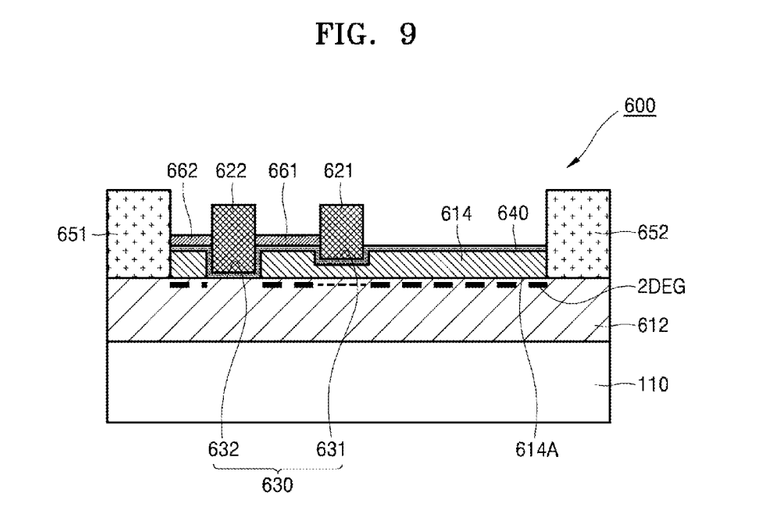
FIG. 9 is a cross-sectional view of a high electron mobility transistor according to example embodiments.

Although a first gate electrode receiving part 431 has the same depth as that of a second gate electrode receiving part 432 in FIG. 8, example embodiments are not limited thereto. For example, as shown in FIG. 9, a HEMT 600 according to example embodiments may include a channel supply layer 614 on a channel layer 612, where the channel supply layer 614 defines a gate electrode receiving part 630 including a first gate electrode receiving part 631 that may have a depth less than that of a second gate electrode receiving part 632. As shown in FIG. 9, the first gate electrode 621 and second gate electrode 622 may be in the first gate electrode receiving part 631 and second gate electrode receiving part 632, respectively. Additionally, an insulation layer 640 may be disposed between the first and second resistive layers 661 and 662 and the channel supply layer 614. The insulation layer 640 may be on a portion of the channel supply layer 614 between the first gate electrode 621 and the drain electrode 652.

Figure 10:
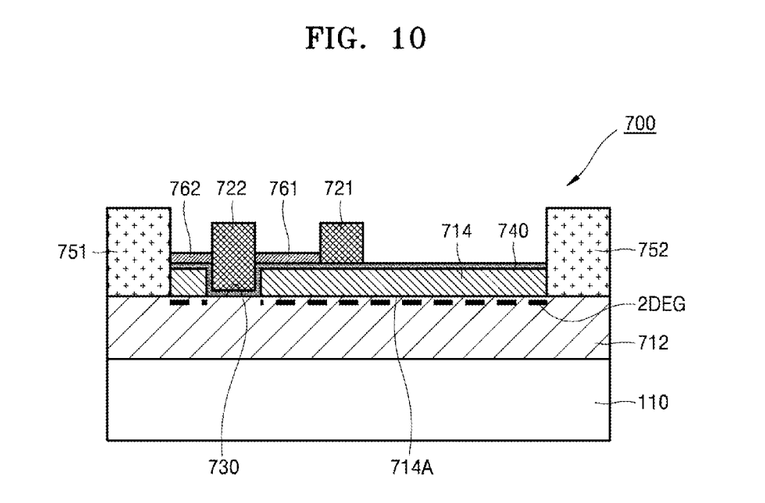
FIG. 10 is a cross-sectional view of a high electron mobility transistor according to example embodiments.

Alternatively, as shown in FIG. 10, the first gate electrode receiving part 631 may be omitted. As shown in FIG. 10, a HEMT 700 according to example embodiments may include a channel supply layer 714 on a channel layer 712, where the channel supply layer 714 defines a gate electrode receiving part 730. The second gate electrode 722 may be in the gate electrode receiving part 730. An insulation layer 740 may be disposed between the first and second resistive layers 761 and 762 and the channel supply layer 714. The insulation layer 740 may be between the second gate electrode 722 and the channel layer 712. The first gate electrode 721 may be on the insulation layer 740 and the channel supply layer 714. The channel supply layer 714 may contact a sidewall of a drain electrode 752 and a sidewall of a source electrode 751 on the channel layer 712.

Also, although the second gate electrode receiving parts 432, 532, 632, and 732 have depths extending up to interfaces 414A, 514A, 614A, and 714A between the channel layers 412, 512, 612, and 712 and the channel supply layers 414, 514, 614, and 714, example embodiments are not limited thereto. For example, although not shown, the second gate electrode receiving parts 432, 532, 632, and 732 may have depths less than those extending up to the interfaces 414A, 514A, 614A, and 714A between the channel layers 412, 512, 612, and 712 and the channel supply layers 414, 514, 614, and 714, e.g., depths spaced desired (or alternatively predetermined) distances from the interfaces 414A, 514A, 614A, and 714A, respectively.

In example embodiments, a HEMT may have the normally-off characteristic. Also, since the second gate electrode that is the floating electrode may be disposed between the source electrode and the first gate electrode to increase the threshold voltage. Also, since the first and second gate electrodes are changed in position, the threshold voltage of the HEMT may be adjusted.

It should be understood that the example embodiments described herein should be considered in a descriptive sense only and not for purposes of limitation. Descriptions of features or aspects within each HEMT according to example embodiments should typically be considered as available for other similar features or aspects in other HEMTs according to example embodiments. While some example embodiments have been particularly shown and described, it will be understood by one of ordinary skill in the art that variations in form and detail may be made therein without departing from the spirit and scope of the claims.

What is claimed is:

1. A high electron mobility transistor comprising:
   a channel layer comprising a first semiconductor material;
   a channel supply layer on the channel layer,
      the channel supply layer comprising a second semiconductor material,
      the channel supply layer configured to generate a 2-dimensional electron gas (2DEG) in the channel layer, and
      an upper surface of the channel supply layer defining a gate electrode receiving part;
   source and drain electrodes spaced apart from each other on the channel layer;
   a first gate electrode in the gate electrode receiving part and between the source electrode and the drain electrode;
   at least one second gate electrode spaced apart from the first gate electrode and in the gate electrode receiving part, the at least one second gate electrode between the source electrode and the first gate electrode, wherein the at least one second gate electrode includes a floating electrode, and the first gate electrode is configured to induce a second gate voltage into the floating electrode if a first gate voltage is applied to the first gate electrode.

2. The high electron mobility transistor of claim 1, wherein
the gate electrode receiving part comprises a first gate electrode receiving part and a second gate electrode receiving part,
the first gate electrode is in the first gate electrode receiving part, and
the at least one second gate electrode is in the second gate electrode receiving part.

3. The high electron mobility transistor of claim 2, wherein
the gate electrode receiving part has a recess shape, and
the gate electrode receiving part is recessed toward the channel layer.

4. The high electron mobility transistor of claim 3, wherein a depth of the gate electrode receiving part extends to one of:
an interface between the channel layer and the channel supply layer, and
a depth less than the interface between the channel layer and the channel supply layer.

5. The high electron mobility transistor of claim 3, wherein a depth of the first gate electrode receiving part is less than a depth of the second gate electrode receiving part.

6. The high electron mobility transistor of claim 1, further comprising: an insulation layer between the gate electrode receiving part and the first and second gate electrodes.

7. The high electron mobility transistor of claim 1, wherein the first gate electrode is configured to induce the second gate voltage into the floating electrode through a top surface of the channel supply layer if the first gate voltage is applied to the first gate electrode.

8. The high electron mobility transistor of claim 1, wherein the second gate voltage induced into the second gate electrode is determined by the first gate voltage applied to the first gate electrode, a distance between the first gate electrode and the floating electrode, and a distance between the floating electrode and the source electrode.

9. The high electron mobility transistor of claim 8, wherein a threshold voltage of the high electron mobility transistor is affected by the second gate voltage induced into the floating electrode.

10. The high electron mobility transistor of claim 1, wherein the first semiconductor material is a GaN-based material.

11. The high electron mobility transistor of claim 1, wherein the second semiconductor material includes at least one nitride that includes at least one of Al, Ga, In, and B.

12. The high electron mobility transistor of claim 1, further comprising:
a first resistive layer connecting the first gate electrode to one of the at least one second gate electrode; and
a second resistive layer connecting one of the at least one second gate electrode to the source electrode.

13. The high electron mobility transistor of claim 12, wherein at least one of the first and second resistive layers has a stripe shape.

14. The high electron mobility transistor of claim 12, wherein at least one of the first and second resistive layers has a film shape.

15. The high electron mobility transistor of claim 12, wherein a resistance value of each of the first and second resistive layers is greater than about 100 k$\Omega$.

16. The high electron mobility transistor of claim 12, wherein the second gate voltage induced into the floating electrode is determined by the first gate voltage applied to the first gate electrode, a resistance value of the first resistive layer, and a resistance value of the second resistive layer.

17. The high electron mobility transistor of claim 12, wherein at least one of the first and second resistive layers is on the channel supply layer.

18. The high electron mobility transistor of claim 17, further comprising: an insulation layer between the channel supply layer and at least one of the first and second resistive layers.

19. A high electron mobility transistor comprising:
a channel layer comprising a first semiconductor material;
a channel supply layer on the channel layer,
the channel supply layer comprising a second semiconductor material,
the channel supply layer configured to generate a 2-dimensional electron gas (2DEG) in the channel layer, and
an upper surface of the channel supply layer defining a gate electrode receiving part;
source and drain electrodes spaced apart from each other on the channel layer;
a first gate electrode on the channel supply layer between the source electrode and the drain electrode;
at least one second gate electrode in the gate electrode receiving part,
the at least one second gate electrode spaced apart from the first gate electrode and between the source electrode and the first gate electrode, wherein the at least one second gate electrode includes a floating electrode, and the first gate electrode is configured to induce a second gate voltage into the floating electrode if a first gate voltage is applied to the first gate electrode.

20. The high electron mobility transistor of claim 19, wherein
the gate electrode receiving part has a recess shape,
the gate electrode receiving part is recessed toward the channel layer, and a depth of the gate electrode receiving part extends to one of
an interface between the channel layer and the channel supply layer, and
a depth less than the interface between the channel layer and the channel supply layer.

21. The high electron mobility transistor of claim 19, further comprising:
a first resistive layer connecting the first gate electrode to one of the at least one second gate electrode; and
a second resistive layer connecting one of the at least one second gate electrode to the source electrode.

22. The high electron mobility transistor of claim 21, wherein at least one of the first and second resistive layers has a stripe shape.

23. The high electron mobility transistor of claim 21, wherein at least one of the first and second resistive layers has a film shape.

24. The high electron mobility transistor of claim 21, wherein a resistance value of each of the first and second resistive layers is greater than about 100 k$\Omega$.

25. The high electron mobility transistor of claim 21, wherein the second gate voltage induced into the floating electrode is determined by the first gate voltage applied to the first gate electrode, a resistance value of the first resistive layer, and a resistance value of the second resistive layer.

26. The high electron mobility transistor of claim 21, wherein at least one of the first and second resistive layers is on the channel supply layer.

27. The high electron mobility transistor of claim 26, further comprising: an insulation layer between the channel supply layer and at least one of the first and second resistive layers.

\* \* \* \* \*